(12) United States Patent
Edwardsen et al.

(10) Patent No.: US 6,880,241 B2
(45) Date of Patent: Apr. 19, 2005

(54) METHOD FOR CONNECTING COAXIAL CABLES TO A PRINTED CIRCUIT BOARD

(75) Inventors: Stephen Dodge Edwardsen, Sandefjord (NO); Alphonse Leon Bron, Bassecourt (CH); Jon Ronander, Tonsberg (NO); Dag Jordfald, Skoppum (NO)

(73) Assignee: General Electric Company A New York Corporation, Schenectady, NY (US)

( * ) Notice: Subject to any disclaimer, the term of this patent is extended or adjusted under 35 U.S.C. 154(b) by 27 days.

(21) Appl. No.: 10/260,595

(22) Filed: Sep. 30, 2002

(65) Prior Publication Data

US 2004/0060171 A1 Apr. 1, 2004

(51) Int. Cl.[7] ............................................. H05B 13/20
(52) U.S. Cl. ........................... 29/828; 29/857; 29/33 M
(58) Field of Search .......................... 29/748, 747, 828, 29/751, 857, 33 M, 825, 837; 174/88 C; 439/578, 63, 581

(56) References Cited

U.S. PATENT DOCUMENTS

| | | | | |
|---|---|---|---|---|
| 4,697,339 A | * | 10/1987 | Verhoeven | 29/828 |
| 5,509,827 A | * | 4/1996 | Huppenthal et al. | 439/638 |
| 5,735,695 A | * | 4/1998 | Heinrich | 439/63 |
| 5,815,916 A | | 10/1998 | Luc | |

* cited by examiner

*Primary Examiner*—Minh Trinh
(74) *Attorney, Agent, or Firm*—Joseph S. Heino; Patrick M. Bergin; Henry Policinski

(57) ABSTRACT

A method for connecting a plurality of coaxial cables to a printed circuit board in a compact connector. The method generally comprises the steps of stripping the coaxial cables, bonding the coaxial cable to a flexible carrier, positioning the coaxial cables over traces of a printed circuit board providing pressure such that electrical contact is maintained between the cables and the printed circuit board.

4 Claims, 4 Drawing Sheets

METHOD FOR CONNECTING COAXIAL CABLES TO A PRINTED CIRCUIT BOARD

BACKGROUND OF THE INVENTION

This invention relates generally to coaxial cables and to methods and devices for connecting coaxial cables to other elements. More particularly, it relates to a method and apparatus for connecting a plurality of coaxial cables to a printed circuit board, or to a printed wiring board, using a compact connector.

There are many situations and applications where it is necessary to connect a multicoaxial cable comprised of a large number of small coaxial elements to the traces of a printed circuit board (PCB) or to a printed wiring board (PWB). Generally, the small coaxial elements need to be attached, detached and reattached from the PCB or PWB rather frequently. When doing so, a large number of the smaller elements must mate up with the PCB or PWB in what is typically a very small location.

In the experience of these inventors, the medical field also has a peculiar need for a method and apparatus for connecting multiple coaxial cables to a PCB in a compact space. Specifically, the scan head of a trans-esophageal echocardiac probe requires a plurality of small coaxial elements to be connected to a PCB, or to a PWB, in a detachable manner but in a very confined space. In a mechanism such as the scan head of a trans-esophageal echocardiac probe, anywhere between 10 and 100 coaxial connections are required. Generally, each coaxial cable is rated between 40 and 44 AWG with capacitance in the range of 50 to 100 pF/m. Current probes offer one-dimensional signal resolution. In the future, probes capable of two dimensional imaging may require in excess of 1000 coaxial cables to be terminated. Accordingly, it is important to note that the method and apparatus of the present invention encompasses more than just a single connection. It could provide for a series of connections in which perhaps 1000 coaxes are first funneled into 100 coaxes and the 100 coaxes are then funneled into 10 coaxes.

The center of a coaxial cable carries a signal, but it is not the only part that carries a signal since the shielding of the coaxial cable is also often attached to the PCB. However, and despite this additional functionality, the carrier to which the coaxes are bound is very small so that it does not add significantly to the size of the overall bundle of coaxes. Small size of the invention is extremely important as the cable bundle must be able to be pulled through an endoscopic shaft, which typically has an internal diameter on the order of 6 millimeters.

BRIEF SUMMARY OF THE INVENTION

Accordingly, it is an object of the present invention to provide a method and apparatus for connecting a plurality of coaxial cables to a printed circuit board without the need for an additional connector element. It is also an object of the present invention to provide a method and apparatus for connecting a plurality of coaxial cables that is easily disassembled and reassembled. Yet another object of the present invention is to provide a method and apparatus for connecting a plurality of such cables in a very compact location. Yet another object the present invention is to provide a method and apparatus for connecting the cables that does not require the use of cement or any other type of bonding media.

The method and apparatus of the present invention meets these objects. The method and apparatus of the present invention provides for a plurality of stripped coaxial cables bonded to a flexible carrier. The method and apparatus further provides for a flexible carrier that is positioned with an array of stripped coaxial cables facing towards the printed circuit board using alignment pins. The method and apparatus then provides for a first rigid element and a second rigid element, between which the printed circuit board and the flexible carrier are pressed. In this manner, contact between the flexible carrier and the printed circuit board is obtained. The method and apparatus of the present invention may also provide for an elastic element under the printed circuit board that provides for a predictable contact force. In the alternative, the method and apparatus may provide for bonding the cable array directly to one of the rigid elements, which would eliminate the need for the flexible carrier but would require that flexible element to be fabricated from nonconducting material. The method and apparatus further provides for connecting the shields of the coaxial cables together by soldering them to a conductive area of the flexible carrier. The foregoing and other features of the method and apparatus of the present invention will be apparent from the detailed description that follows.

DETAILED DESCRIPTION OF THE INVENTION

The following detailed description is intended to describe the preferred embodiments that are depicted in the various figures referred to above. It is to be understood, however, that changes could be made to that which is specifically described and shown that would still fall within the scope of the present invention.

Figure 1:
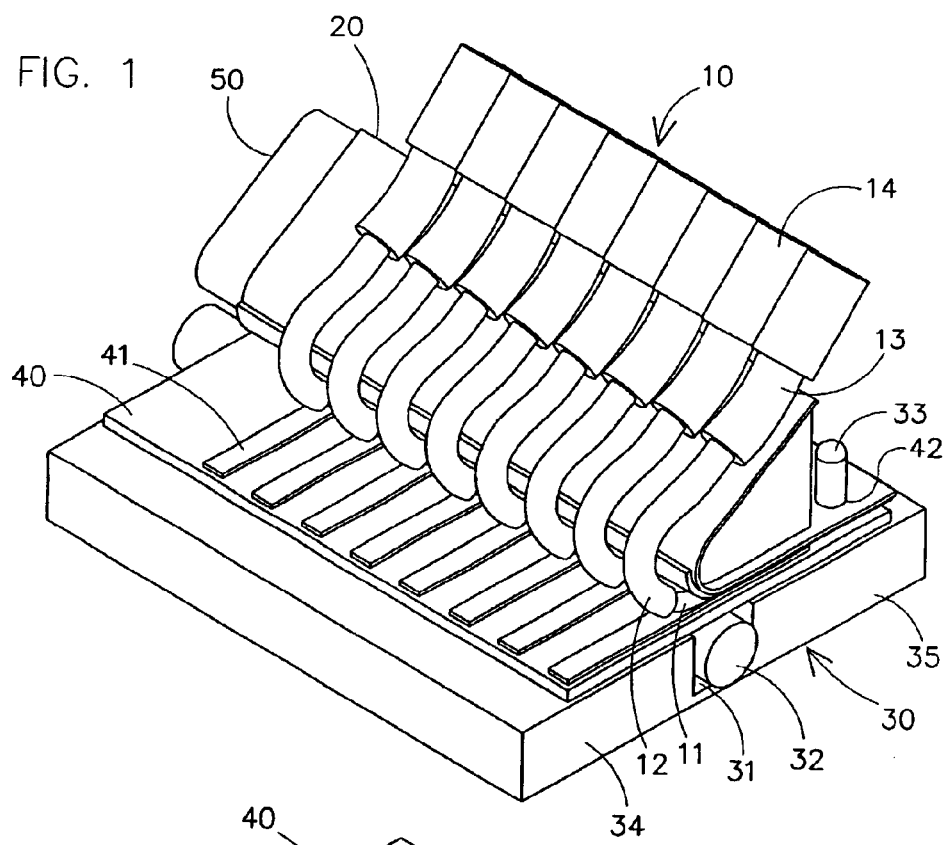
FIG. 1 is a top, front and left side perspective view of the apparatus employed in the method of the present invention

Referring now to the drawings in detail, wherein like numbered elements refer to like elements throughout, FIG. 1 illustrates a preferred embodiment of the apparatus employed in conjunction with the method of the present invention. As can be seen from FIG. 1, the apparatus and method of the present invention provides for a complete connection package. What is not seen is that the connection is very small. Also, the method and apparatus of the present invention is utilized with an array of parallel coaxial cables, generally identified 10, each of which is already present in the device for which this invention is intended. A base plate 30 is also typically an existing part of the apparatus for which the present invention is used. As already stated, the apparatus used with the present method is extremely small and uses few parts. In particular, the part secured to the coaxial cables (the flexible carrier) adds very little to the coaxial cables themselves, and therefore this part can be assembled before the coaxial cables are pulled through a narrow endoscope. The rest of the invention, which is also small, can be assembled after the cables have been pulled through the endoscope.

Figure 3A:
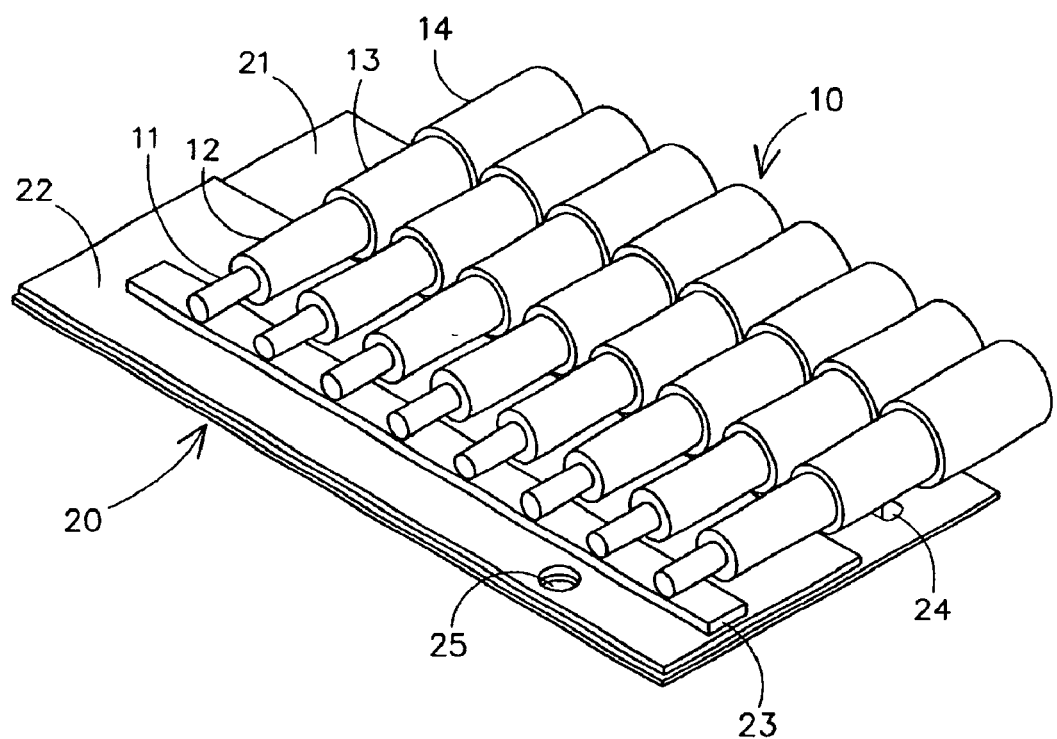
FIG. 3A is a top, front and left side perspective view of a parallel array of coaxial cables as they are mounted on a flexible carrier.
Figure 3B:
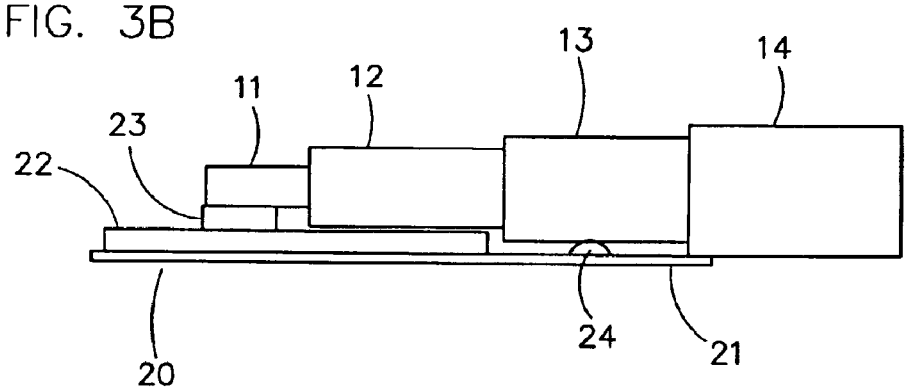
FIG. 3B is an enlarged left side elevational view of the cable and the flexible carrier shown in FIG. 3A.

Referring now to FIG. 3B, that figure shows a left side elevational view of the coaxial cable array 10 and the flexible carrier, generally identified 20, that is employed in the present invention. As shown, four distinct layers in each coaxial cable 10 can be observed. First, the center conductor 11 of the coaxial cable 10 is fabricated of an electrically conductive material and is provided to conduct electrical signals. Surrounding the conductive center 11 of the coaxial cable 10 is an inner conductor insulator, or conductor jacket, 12. The conductor jacket 12 is fabricated from an electrically nonconductive material and is, in turn, surrounded by a shield 13. The shield 13 is generally fabricated from electrically conductive material. The outer protective jacket 14 of the coaxial cable 10 surrounds the shield 13 and is also electrically nonconductive.

Figure 2:
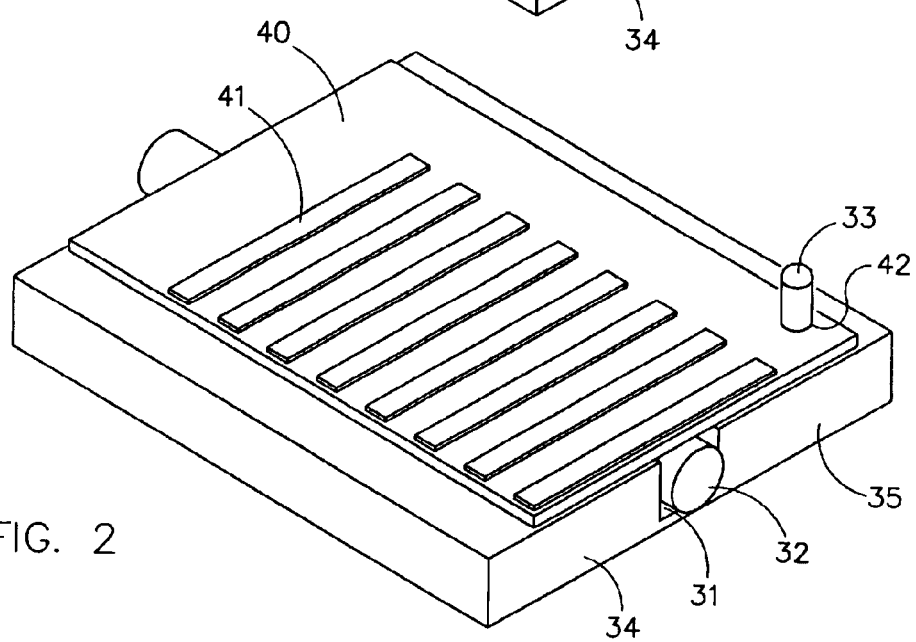
FIG. 2 is a top, front and left side perspective view of one embodiment of the base plate and printed circuit board used in the method and apparatus of the present invention.

Methods for stripping coaxial cables 10 are plentiful and well known in the art. Nearly any of these methods could be used strip the coaxial cables 10 of the present invention such that the cables 10 end up resembling those as illustrated in FIG. 3A. After the coaxial cables 10 are stripped, they are connected to a flexible carrier 20 as shown in FIG. 3A. The flexible carrier 20 is generally rectangular in shape and very thin. The shield 13 of the coaxial cable 10 is connected directly to the flexible carrier 20. See FIG. 3B. The conductive layer 21 of the flexible carrier 20 is generally a copper foil, although other types of conductive layers 21 could be used. On the conductive layer 21 is a much smaller adhesive layer 23. The adhesive layer 23 is typically polyimide foil, a flexible film for electrical insulation. The adhesive layer 23 is used to attach the center conductor 11 of the coaxial cable 10 to the flexible carrier 20. The adhesive layer 23 used to connect the center conductor 11 to the flexible carrier 20 is required to be very thin, normally between 0.3 mm and 0.7 mm. The flexible carrier 20 also has at least one positioning aperture 25, each of which corresponds to a complementary positioning pin 33 of the base plate 30. See FIG. 2.

Figure 4:
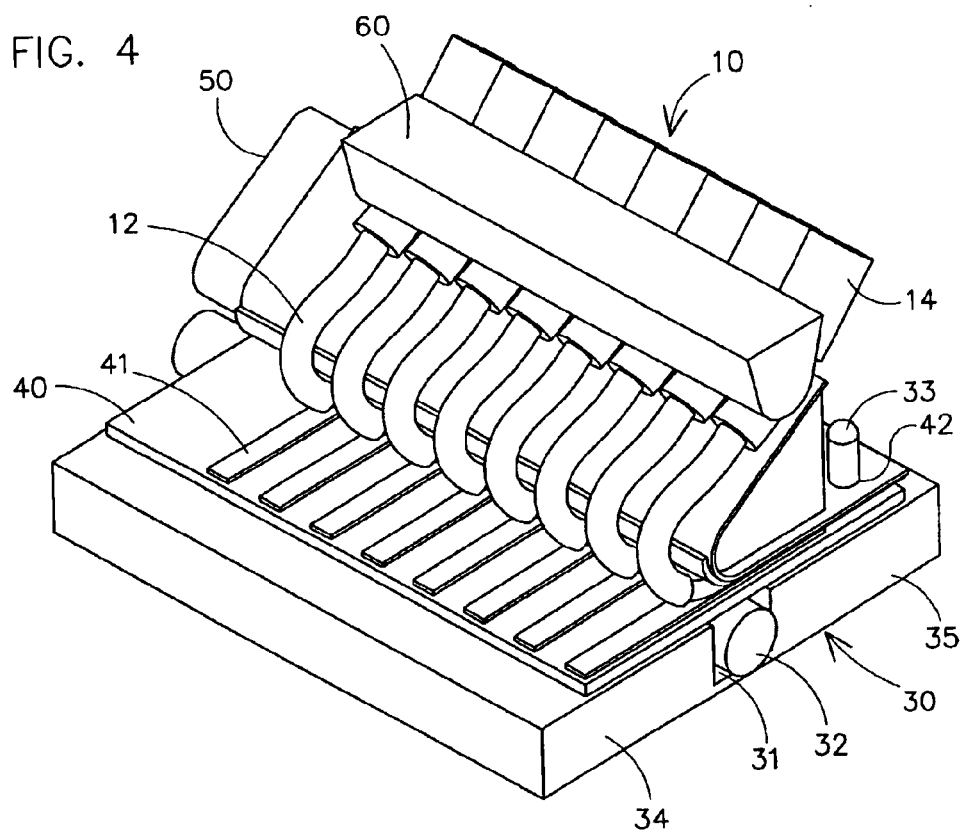
FIG. 4 is a top, front and left side perspective view of another embodiment of the present invention in which a shield contact beam is visible.

In one alternative embodiment of the present invention the flexible carrier 20 may also be attached to the coaxial cables 10 through the shield 13. The shield 13 of the coaxial cables 10 is a conductive material as is the conductive layer 21 of the flexible carrier 20. See FIG. 3B. The shield 13 is normally attached to the flexible carrier 20 using solder, although any electrically conductive means for attaching the shield 13 of the coaxial cable 10 to the flexible carrier 20 would work. However, the connection 24 need not be electrically conductive. When assembled and connected as shown in FIG. 4, the shields 13 of the coaxial cables 10 are connected to a beam 50. The beam 50 is in turn connected to the base plate 30. The base plate 30 is attached to the back side of the PCB 40, which permits signal carriage on both the front and back sides of the PCB 40.

Referring again to FIG. 1, the method and apparatus of the present invention provides for a rigid base plate 30. The base plate 30 is generally rectangular and similar in size, but not in thickness, to the PCB 40, which will be discussed later in this detailed description. This configuration results in formation of a first rectangular portion 34 and a second rectangular side portion 35 in addition to the central open channel 31 running longitudinally through the base plate 30. The base plate 30 is typically fabricated from an electrically conductive material.

The center channel 31 of the base plate 30 is designed to hold an elastic element 32 within it. The elastic element 32 itself is designed to protrude slightly upwardly from the upper horizontal surface of the base plate 30 such that the elastic element 32 provides continuous upward pressure on the PCB 40.

The PCB 40 is typically flexible and has a set of parallel metal traces 41 along its top and a set of metal traces (not shown) along its bottom. The metal traces 41 along the top of the PCB 40 are designed to contact the center conductors 11 of each of the coaxial cables 10. The metal traces (not shown) on the bottom of the PCB 40 are designed to conduct electrical signals to the base plate 30, which receives electronic signals from the shield 13. The PCB 40 is rigidly mounted on the base plate 30 and features a plurality of apertures 42 similar to the flexible carrier 20 such that the PCB 40 is positioned exactly over the array of coaxial cables 10 so as to make the best electrical contact with the coaxial cables 10 as is possible.

The present invention also employs three specific methods of fastening the individual coaxial cables 10 to the flexible carrier 20. For example, FIG. 3B shows a conductive layer 21, typically of copper foil, that covers the entire flexible carrier 20. The conductive layer 21 also features a much smaller insulating layer 22, typically fabricated from a polyimide foil. The insulating layer 22 covers the part of the flexible carrier 20 that is pressed into the PCB 40, as shown in FIG. 4 including the positioning holes 25. The center conductors 11 of the cables 10 are bonded to the insulating layer 22 using adhesive, glue, or tape. A tool, called a "rake" (not shown), is normally used to regulate the spacing and orientation of the coaxial cables 10 on the flexible carrier 20. In practice, the insulating layer 22 extends well past the center connectors 11 and under the conductor jackets 12. The insulating layer 22 terminates between the conductor jacket 12 and the shield 13. The shields 13 are generally soldered to the conducting layer 21, thereby permitting an electrical continuum between the flexible carrier 20 and the rigid beam 50 or the shield contact beam 60. See FIG. 4. Both the rigid beam 50 and the shield contact beam 60 are connected to the PCB 40, normally by bolts through base plate 30 and the PCB 40. Therefore, this arrangement permits the exchange of a signal from the center conductor 11 on one side of the PCB 40 and a second electrical signal on the other side of the PCB 40.

The second method of fastening the coaxial cables 10 to the PCB 40 involves bonding the coaxial cables 10 to the flexible carrier 21 using an adhesive 23, although this step is not required to carry out the method of the present invention. For example, the outer jackets 14 of the coaxial cables 10 need not be secured to the flexible carrier 20 so long as the shield 13 and center conductor 11 are connected to the PCB 40.

In other situations, the insulating layer 23 may be eliminated altogether and its function replaced by an adhesive extending over the same area of the insulating layer that it replaces. In this case, the carrier is typically a copper foil with an adhesive spread over it. Normally, the adhesive used will be heat activated. In this manner, the adhesive will not prevent the flexible carrier 20 and coaxial cables 10 from being separate from the PCB 40.

Figure 5:
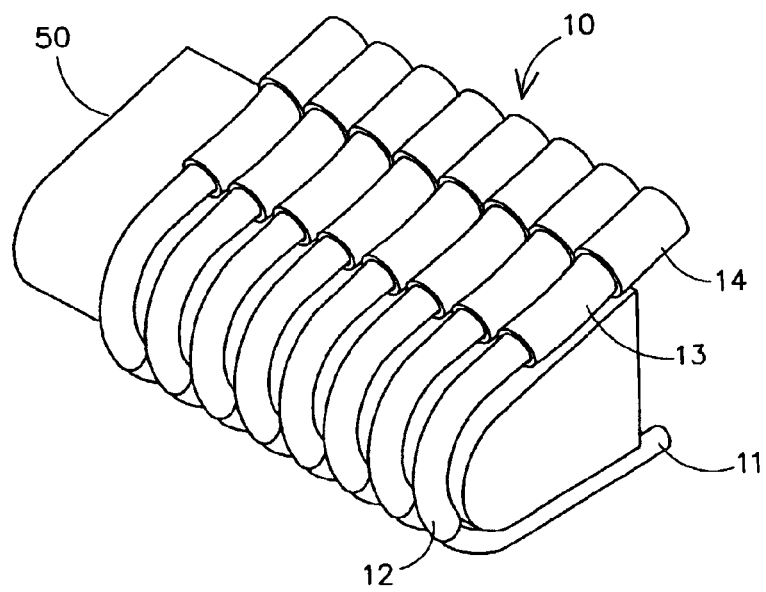
FIG. 5 is a top, front and left side perspective view of yet another embodiment of the present invention wherein the cables are bonded directly to the beam.

In yet another embodiment, as shown in FIG. 5, the flexible carrier 20 has only a single insulating layer 23 and both the center conductor 11 and the shield 13 of the coaxial cables 10 are bonded to the flexible carrier 20 with adhesive. If this embodiment of the flexible carrier 20 is used, then the shields 13 of the coaxial cables 10 must be connected to the carrier 20 using an additional conductive element, for example, the second beam 60 as shown in FIG. 4. Typically, this second beam, or shield contact beam, 60 would press the shields 13 and flexible carrier against the first beam 50. The shield contact beam 60 would then be connected to the first beam 50 using screws, or some other means for precise attachment such that good contact is maintained.

Figure 6:
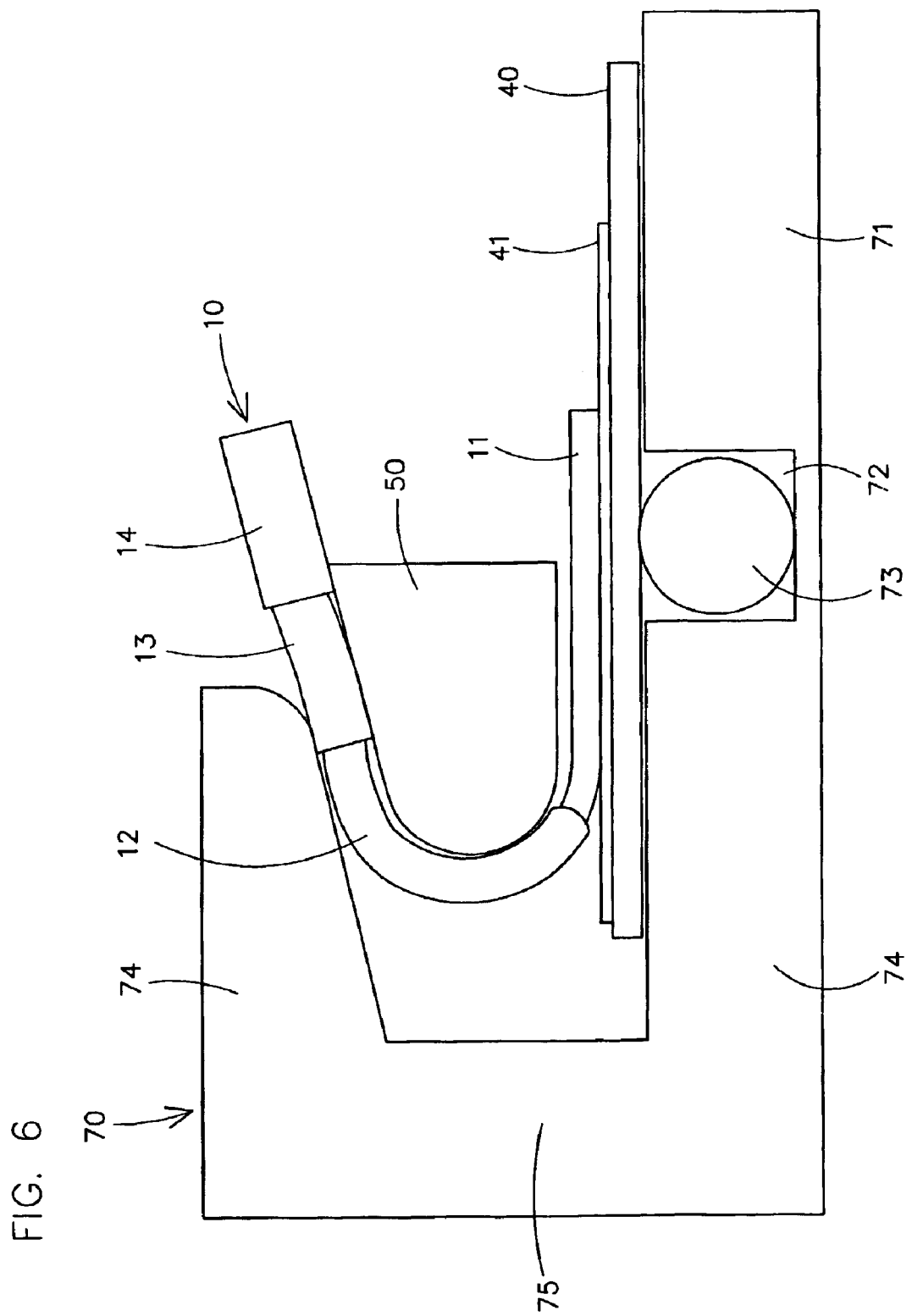
FIG. 6 is an enlarged left side elevational view of another embodiment of the device of the present invention.

The method and apparatus of the present invention also provides for a clamshell beam and base plate assembly, generally identified 70. As shown in FIG. 6, wherein the base of the assembly 70 resembles the base plate 30 of other embodiments, the assembly 70 has first and second rectangular portions 71, 74, an elastic element 73 and a central channel 72. However, it differs in that it offers a vertical member 75 that provides for an overhanging clamshell member 76. This configuration eliminates the need for the shield contact beam 60 as shown in FIG. 4 by providing the clamshell member 76. The rigid beam 50, the flexible carrier 20 and the coaxial cables 10 are then pressed into the clamshell assembly 70 and secured. The rigid beam 50 may be secured through use of elastic elements around the rigid beam 50 and the clamshell assembly 70, as noted previously, or the rigid beam 50 and clamshell beam and base plate assembly 70 may provide for an area without coaxial cables, perhaps on the periphery of the rigid beam and clamshell assembly 70 such that the rigid beam 50 and the clamshell assembly 70 may be bolted together. In either case, it is important to provide some means for applying pressure to keep the coaxial cables 10 in contact with the PCB 40.

In application, the method and apparatus of the present invention requires placement of the flexible carrier 20 on the PCB 40 with the coaxial cables 10 facing downwardly. The positioning pin 33 on the base plate 30 and the positioning aperture 25 in the flexible carrier 20 are aligned thereby accurately positioning the flexible carrier 20 on the PCB 40.

Generally, the flexible carrier 20 and the PCB 40 are locked into place using a first rigid beam 50. The first rigid beam 50 is locked into place on the base plate 30 using screws or some other means of attachment (not shown). The screws may be mounted through an extension of the beam 50 so that they do not interfere with the contact points along the array of coaxial cables 10. The rigid beam 50 presses the center conductor 11 portions of the coaxial cables 10 down onto the PCB 40. The distance between the rigid beam 50 and the base plate 30 is typically fixed by design to avoid damage to the delicate center conductors 11. Typically, this is accomplished by use of a washer of a given thickness, thereby increasing pressure on the rigid beam 50 towards the base plate 30 which will not reduce the design clearance and damage the coaxial conductors 11.

The base plate 30 also generally provides for an elastic element 32 acting on the PCB 40 from the base plate 30 in order to ensure that suitable pressure is applied and maintained on the PCB 40 towards the center conductors 11 of the coaxial cables 10. Rubber is frequently chosen for this elastic element 32 so that pressure is maintained constant over time. It is also possible to use an elastic element 32 in the rigid beam 50 over the flexible carrier 20 instead of, or in addition to, the illustrated elastic element 32 to provide pressure on the flexible carrier 20 so that it remains in contact with the PCB 40.

FIG. 5 illustrates yet another embodiment of the device of the present invention. As can be seen from FIG. 5, this embodiment does away with the flexible carrier 20 entirely. In this embodiment, the center conductor 11 of the coaxial cables 10 is bonded directly to the rigid beam 50. In this embodiment, the rigid beam 50 is fabricated from an electrically nonconductive material.

The present invention includes a method for attaching the individual coaxial cables 10 to their respective contact points and involves the following steps. First, a plurality of coaxial cables 10 are stripped to reveal the shield 13, center conductor jackets 12 and center conductors 11. The outer jacket 14 is completely removed from this stripped area. See FIGS. 3A and 3B.

Second, the center conductors 11 are bonded to a flexible carrier 20. Generally, the bonding is permanent. The center conductors 11 are not electrically connected to the flexible carrier 20 and the bonding can employ a stiff or flexible elastic material such as glue or tape. The distance between the coaxial cables is typically 0.3 mm to 0.7 mm center to center.

Third, the flexible connector 20 is positioned on the PCB 40. The flexible connector 20 typically has an aperture 25 that permits the passage of a pin 33 on the base plate 30 therethrough. This pin 33 ensures that the flexible connector 20 is accurately placed such that the coaxial cables 10 align with the traces 41 of the PCB 40. See FIG. 2. The PCB 40 is then attached to and rests on a rigid base plate 30 which is typically conductive and made of metal. The PCB 40 has an aperture 42 that admits passage of the pin 33 therethrough.

Electrical contact is established by placing the flexible carrier 20 on the PCB 40 with the coaxial cables 10 facing downwardly. The positioning apertures 25, 42 of both the flexible carrier 20 and the PCB 40, respectively, are lined up for accurate placement at this stage. Contact is maintained by continuous pressure applied by mounting a rigid beam 50 over the flexible carrier 20. Pressure is normally applied using a plurality of screws to hold the rigid beam 50 over the flexible carrier 20. In this manner, the center conductors 11 of the cables 10 are pressed down continuously onto the traces of the PCB 40. The method and apparatus of the present invention may provide for a spacer of some sort between the PCB 40 and the flexible carrier 20 such that the delicate inner conductors 11 of the coaxial cables 10 are not damaged during assembly. See FIG. 1.

The method and apparatus of the present invention may also provide for an elastic element 32 acting on the PCB 40. See FIG. 2. The elastic element 32 is normally made of a resilient rubber and is located between the PCB 40 and the base plate 30 such that the elastic element 32 applies continuous upward pressure on the PCB 40 and maintains good electrical contact.

The method and apparatus of the present invention may also provide for use of yet another elastic element instead of or in addition to the rigid beam 50 to secure the flexible connector 20 to the PCB 40. For example, the method and apparatus of the present invention could employ an elastic band (not shown) around the base plate 30 and the flexible carrier 20 that prevent relative motion between the two members. An additional advantage of using an elastic band is that it reduces the time it takes to connector disconnect the coaxial cables 10.

The method of the present invention provides three different methods for terminating the shields 13 on the PCB 40. One method is displayed in FIG. 3A and shows the flexible carrier 20 consisting of two layers, a conductive layer 21 and an insulating layer 22, typically of polyimide foil. The method of the present invention provides for a rake, or some other tool, that obtains regular spacing of the coaxial cables 10 for accurately bonding the center conductors 11 to the insulating layer 22 using an adhesive 23. An alternative to this method is to eliminate the insulating layer 23 and replace it with adhesive extending over the same area. In this case the carrier 20 is typically a copper foil with an adhesive covering.

In summary, the present invention provides a method and an apparatus for connecting an array of multiple coaxial cables 10 to a PCB 40 in a compact connector comprising the steps of stripping a coaxial cable 10 to expose the shield 13, conductor jacket 12 and inner conductors 11, bonding the shield 13 of the coaxial cables 10 to a flexible carrier 20 using an adhesive, positioning the center connectors 11 of the coaxial cables 10 on the top side traces 41 of the PCB 40, positioning the bottom traces of the PCB 40 in alignment with the conductive elements on the base 30, providing a pair of nonconductive rigid elements 50, 60 on top of the flexible carrier 20 and underneath the printed circuit board 40 such that when the upper rigid element 60 is connected to the lower rigid element 50 via a screw, or some other mean of connection, they may be tightened pressed together, and providing an elastic element 32 underneath the PCB 40 to create a predictable contact force. The method and apparatus of the present invention provides that, in alternative embodiments, the center connectors 11 of the coaxial cables 10 are connected to the traces 41 both with and without the use of a flexible carrier 20. Also, the outer jackets 14 of the coaxial cable 10 may be bonded to the flexible carrier 20, should a flexible carrier 20 be required.

What is claimed is:

1. A method for connecting a plurality of coaxial cables to a printed circuit board comprising the steps of providing an alignment aperture on the printed circuit board, providing a coaxial cable having a center conductor and a shield, stripping the plurality of coaxial cables to expose the center conductor and shield, providing a flexible carrier having an alignment aperture, bonding the plurality of center conductors of the coaxial cables to the flexible carrier using an electrically non-conductive adhesive, bonding the shields of the coaxial cables to the flexible carrier, providing a first rigid element adjacent the printed circuit board, providing a second rigid element adjacent the printed circuit board and to the opposite side of the first rigid element, pressing the second rigid element down onto the plurality of coaxial cables, onto the printed circuit board, and onto the first rigid element such that electrical contact is obtained thereby and, providing a base plate having a positioning pin for aligning the aperture in the printed circuit board and the aperture in the flexible carrier with the base plate.

2. The method of claim 1, wherein the base plate and the rigid beam are connected using a fastener assembly.

3. The method of claim 2, wherein the base plate has a longitudinally extending channel having an elastic element situated in the channel-such that when the printed circuit board is mounted on the base plate the elastic element provides continuous upward pressure on the printed circuit board.

4. The method of claim 3 including the step of bonding the plurality of coaxial cables directly to an electrically non-conductive beam and the beam attaches to the printed circuit board and base plate.

* * * * *

UNITED STATES PATENT AND TRADEMARK OFFICE
CERTIFICATE OF CORRECTION

PATENT NO. : 6,880,241 B2
DATED : April 19, 2005
INVENTOR(S) : Edwardsen et al.

It is certified that error appears in the above-identified patent and that said Letters Patent is hereby corrected as shown below:

Column 5,
Line 58, the word "connector" should be replaced with -- connect or --.

Column 8,
Line 30, please delete the "-" between "channel" and "such".

Signed and Sealed this

Eleventh Day of October , 2005

JON W. DUDAS
*Director of the United States Patent and Trademark Office*